United States Patent
Hayashi

(10) Patent No.: US 8,115,901 B2
(45) Date of Patent: Feb. 14, 2012

(54) EXPOSURE APPARATUS

(75) Inventor: Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 593 days.

(21) Appl. No.: 12/273,050

(22) Filed: Nov. 18, 2008

(65) Prior Publication Data
US 2009/0128795 A1 May 21, 2009

(30) Foreign Application Priority Data

Nov. 20, 2007 (JP) ................................. 2007-299963

(51) Int. Cl.
*G03B 27/52* (2006.01)
*H01L 21/683* (2006.01)

(52) U.S. Cl. .............................. 355/30; 355/75; 361/234

(58) Field of Classification Search ..................... 355/30, 355/50, 51, 66, 67, 75; 34/275; 361/234
See application file for complete search history.

(56) References Cited

U.S. PATENT DOCUMENTS

| | | | | |
|---|---|---|---|---|
| 6,169,652 B1 * | 1/2001 | Klebanoff | ..................... | 361/234 |
| 6,279,249 B1 * | 8/2001 | Dao et al. | ........................... | 34/61 |
| 6,642,531 B1 * | 11/2003 | Powers | ........................ | 250/492.2 |
| 6,781,673 B2 * | 8/2004 | Moors et al. | ..................... | 355/76 |
| 6,813,002 B2 * | 11/2004 | Ota | ................................... | 355/55 |
| 7,232,233 B2 | 6/2007 | Suzuki et al. | | |
| 7,248,332 B2 | 7/2007 | Owen | | |
| 2007/0079525 A1 * | 4/2007 | Sogard | ............................. | 34/275 |
| 2008/0246939 A1 * | 10/2008 | Yonekawa et al. | ............... | 355/53 |
| 2010/0068659 A1 * | 3/2010 | Hamaya | ........................ | 430/325 |

FOREIGN PATENT DOCUMENTS

| | | |
|---|---|---|
| JP | 2003-045782 A | 2/2003 |
| JP | 2006-032957 A | 2/2006 |
| JP | 2006-120776 A | 5/2006 |

* cited by examiner

*Primary Examiner* — Hung Henry Nguyen
*Assistant Examiner* — Steven H Whitesell Gordon
(74) *Attorney, Agent, or Firm* — Canon U.S.A., Inc. IP Division

(57) ABSTRACT

An exposure apparatus is configured to expose a pattern formed on an original onto a substrate using extreme ultraviolet light. The exposure apparatus includes a stage configured to move at the time of exposure, an electrostatic chuck which is provided on the stage and is configured to hold the original, an electrode which is provided outside the electrostatic chuck on the stage via an insulator, and an electric field forming member which is provided so that an absolute value of an electric potential difference with respect to the electrode is greater than an absolute value of an electric potential difference with respect to the original at a position facing the electrode. The particle adherence to the original can be effectively avoided.

7 Claims, 8 Drawing Sheets

EXPOSURE APPARATUS

BACKGROUND OF THE INVENTION

The present invention relates to an exposure apparatus that is configured to expose a pattern on an original onto a substrate. The present invention is preferably applied to an exposure apparatus which performs an exposure using short wavelength light such as EUV light (0.5 to 50 nm) under a high-vacuum atmosphere.

In an optical lithography technology for manufacturing semiconductors, the wavelength of the exposure light has been shortened from an i-line or a g-line to a KrF excimer laser or an ArF excimer laser in accordance with the miniaturization of the semiconductors. If the wavelength of the exposure light has been shortened, a finer mask pattern can be exposed onto a wafer.

Recently, an EUV lithography using extreme ultraviolet light (EUV light: 13 to 20 nm) whose wavelength is shorter than that of ultraviolet light has attracted attention. Japanese Patent Laid-Open No. 2003-45782 discloses a reduced projection exposure apparatus using the EUV light as an exposure light.

A problem common to conventional exposure apparatuses using an i-line, a KrF excimer laser, an ArF excimer laser, or an EUV is that a defect is generated by a particle adhering to the original. In the exposure apparatus using the i-line, the g-line, the KrF excimer laser, and the ArF excimer laser, the adhesion of the particle to the original was avoided by placing a transparent protection film called a pellicle at a distance of several millimeters from the original.

However, in the EUV exposure apparatus to which the present invention applies, there is no pellicle transparent for the EUV light. If the absorption of the EUV light is allowed to some extent, the pellicle can be made of a material having a high-transmittance. However, when a required transmittance of the EUV light should be obtained, the thickness of the pellicle needs to be around several tens of nanometers. It is difficult for the thin film whose thickness is several tens of nanometers to withstand the harsh environment such as heat generated by the absorption of the EUV light.

Therefore, the original in the EUV exposure apparatus have to be pellicleless. If the particle is generated in the exposure apparatus, the adhesion of the particle to the original is concerned.

Japanese Patent Laid-Open Nos. 2006-32957 and 2006-120776 disclose a technology for preventing a contaminant such as a particle from adhering to an optical element or a substrate in the exposure apparatus.

However, in the technology disclosed in Japanese Patent Laid-Open No. 2006-32957, a charged body is provided on a projection system or a substrate table which should be protected from the contaminant, and the electric field is formed between the charged body and the projection system or the charged body and the substrate table. In this configuration, the contaminant charged with the same polarity as that of the charged body is not attracted to the charged body, but is attracted to the projection system or the substrate table. Therefore, an intended effect can not be obtained.

In a technology disclosed in Japanese Patent Laid-Open No. 2006-120776, an electrode is buried in an electrostatic chuck that holds the original. In this case, the particle is attracted to the electrostatic chuck, and the adherence of the particle to the absorption surface of the original is concerned. If the particle is adhered to the absorption surface of the original, the surface accuracy of the original may be influenced.

BRIEF SUMMARY OF THE INVENTION

The present invention provides an exposure apparatus which can effectively prevent the particle from adhering to an original.

An exposure apparatus as one aspect of the present invention is an exposure apparatus configured to expose a pattern formed on an original onto a substrate using extreme ultraviolet light. The exposure apparatus includes a stage configured to move at the time of exposure, an electrostatic chuck which is provided on the stage and is configured to hold the original, an electrode which is provided outside the electrostatic chuck on the stage via an insulator, and an electric field forming member which is provided so that an absolute value of an electric potential difference with respect to the electrode is greater than an absolute value of an electric potential difference with respect to the original at a position facing the electrode.

Other aspects of the present invention will be apparent from the embodiments described below with reference to the drawings.

DETAILED DESCRIPTION OF THE EMBODIMENTS

Exemplary embodiments of the present invention will be described below with reference to the accompanied drawings.

Embodiment 1

Figure 1:
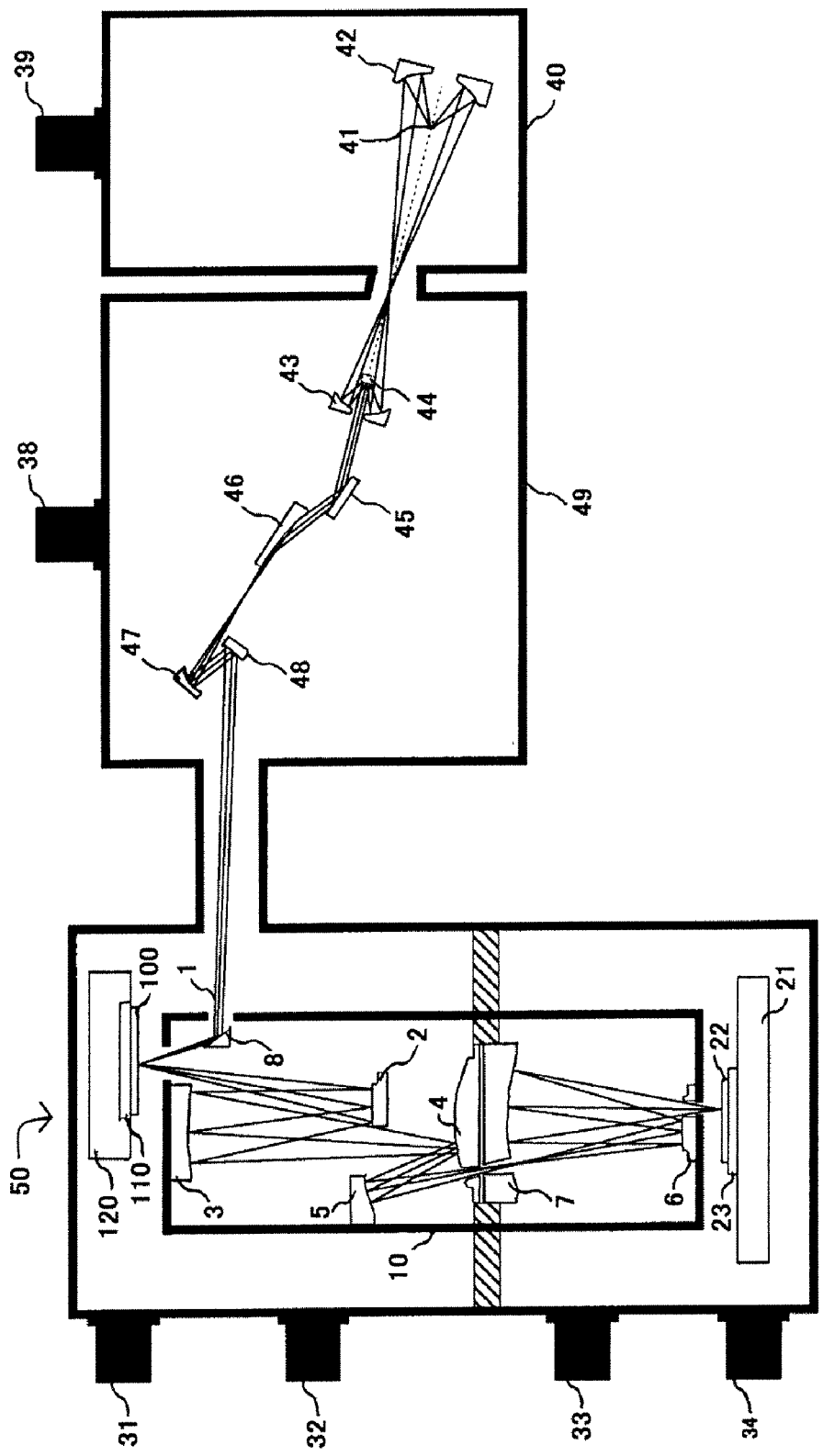
FIG. 1 is a schematic view of an EUV exposure apparatus that is Embodiment 1 of the present invention.

In Embodiment 1 of the present invention, an exposure apparatus using extreme ultraviolet light (EUV light that has a wavelength of 0.1 to 30 nm, preferably 10 to 15 nm) will be described. FIG. 1 shows a schematic view of an exposure apparatus of Embodiment 1.

There are several types of light sources as a light source 40. A laser generating plasma light source that is one of the light sources can emit light which has only a wavelength band which is substantially necessary by selecting a material of a target 41. For example, when Xe, as a target material, is belched from a pulse nozzle and a pulse laser is irradiated to Xe to generate plasma, EUV light whose wavelength is 13 to 14 nm is emitted. The EUV light 1 emitted from the target 41 is condensed by a condensing mirror 42, and illuminates an original 100 via illumination optical system mirrors 43 to 48 and an original illumination mirror 8. The EUV light 1 which has illuminated the original 100 is introduced to a substrate 22 by projection optical mirrors 2 to 7 and a reduced projection exposure is performed.

The original 100 is held by an original chuck 110 (an electrostatic chuck), and the original chuck 110 is disposed on an original stage 120 (stage). The original stage 120 moves at the time of exposure. The substrate 22 is held by a substrate chuck 23, and the substrate chuck 23 is disposed on a substrate stage 21. The substrate stage 21 also moves at the time of exposure.

An exposure apparatus of the present invention has exhaust equipments 31 to 34, 38, and 39 for performing an exposure under a high-vacuum environment. The exhaust equipments 31 to 34, 38 and 39 exhaust gas in the exposure apparatus to the outside. Each of the original stage 120 and the substrate stage 21 has a mechanism that can drive the original or the substrate under the vacuum environment, and is synchronized to scan by the velocity ratio which is proportional to the reduced magnification. The positions and the postures of the original stage 120 and the substrate stage 21 are monitored by a laser interferometer (not shown) and controlled.

When one exposure has finished, the substrate stage 21 performs a step movement in X and Y directions to move to a start position of the next scanning exposure and performs the exposure again.

When the original stage 120 performs a scanning action at the time of exposure, a particle may be generated because of friction of a sliding part, a cable, or the like, of the original stage 120. In the case where a particle of 100 nm is adhered to the original, when the reduced magnification of the projection optical system is ¼, a defect of 25 nm is generated on a wafer. Therefore, if a design rule of 32 nm is applied, the defect as described above is a problem for manufacturing devices. Furthermore, a particle that is equal to or less than 100 nm, i.e. in several tens of nanometers order, can be enough to make a defect on the devices. Therefore, it is necessary to prevent the particle from adhering to the original. The particles include an organic substance and an inorganic substance, and both particles should be prevented from adhering to the original.

The particles of several tens of nanometers generated from the generating source as described above may be emitted into the exposure apparatus 50 at a velocity equal to around a scanning velocity of the original stage 120. The emitted particles are detached from the generating source and are in contact with members inside the exposure apparatus 50. Therefore, the emitted particles may be at least in a charged state although the valence is not clear. In this case, in order to change the track of the particle under the vacuum environment, it is effective to use an electric field. In order to protect the original 100 from the particles using the electric field, the configuration of an electrode that forms the electric field is important.

Figure 2:
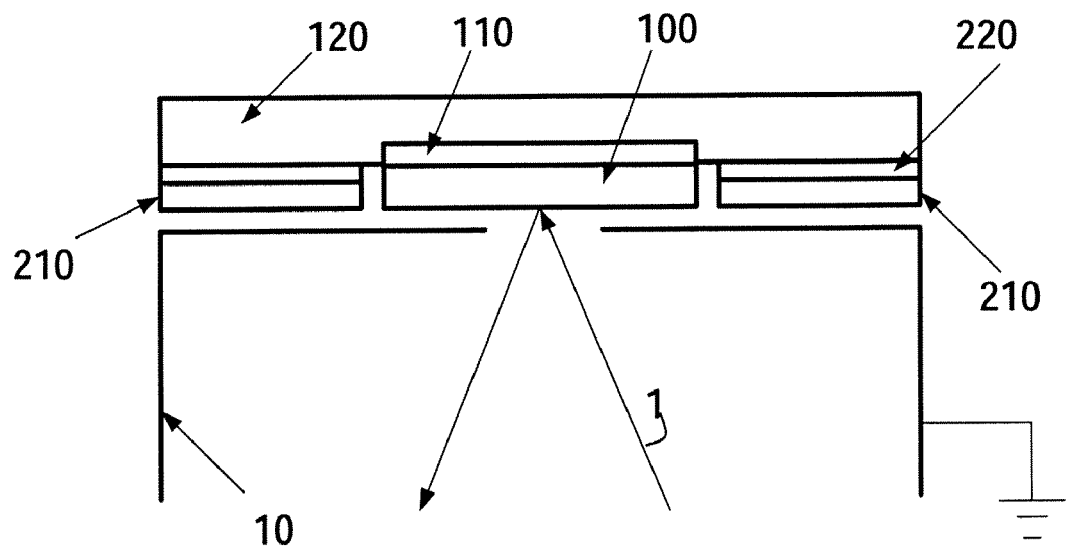
FIG. 2 is a schematic cross-sectional view showing the vicinity of an original of an EUV exposure apparatus of Embodiment 1.

Referring to FIG. 2, the present embodiment will be described in detail and the electric field which is formed by applying the present embodiment and its effect will be specifically described.

FIG. 2 is an enlarged view in the vicinity of the original 100 of the EUV exposure apparatus shown in FIG. 1. An electrode 210 is configured to be parallel to the original 100 and surround the original 100. The words "An electrode 210 is configured to be parallel to the original 100" are not limited to the case where the electrode 210 is completely parallel to the original 100, but include the case where the electrode 210 is substantially parallel to the original 210.

Figure 3:
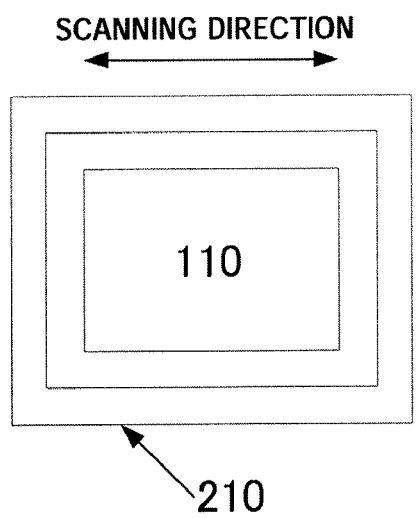
FIG. 3 is a view showing the arrangement of an electrode of Embodiment 1.
Figure 4:
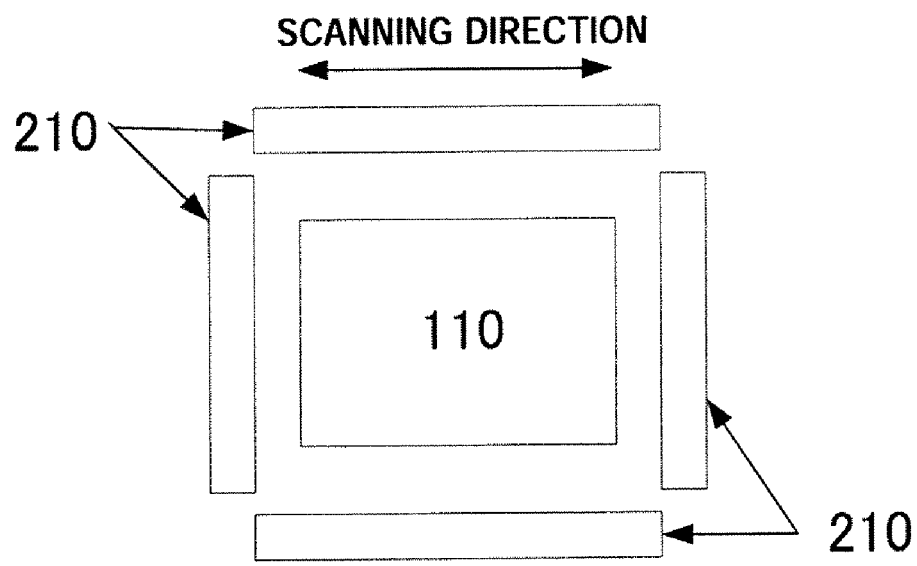
FIG. 4 is a view showing the arrangement of electrodes of Embodiment 1.
Figure 5:
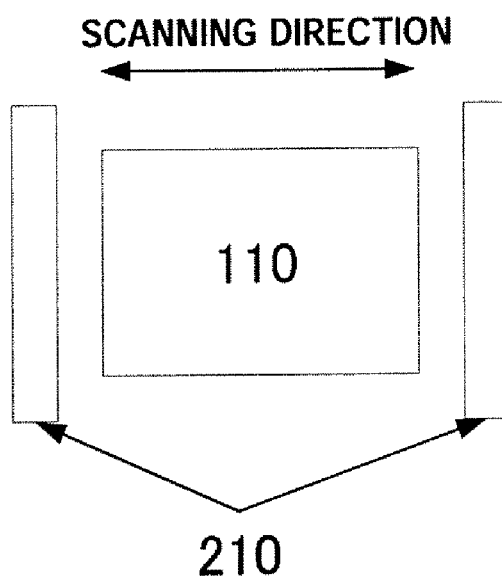
FIG. 5 is a view showing the arrangement of electrodes of Embodiment 1.
Figure 6:
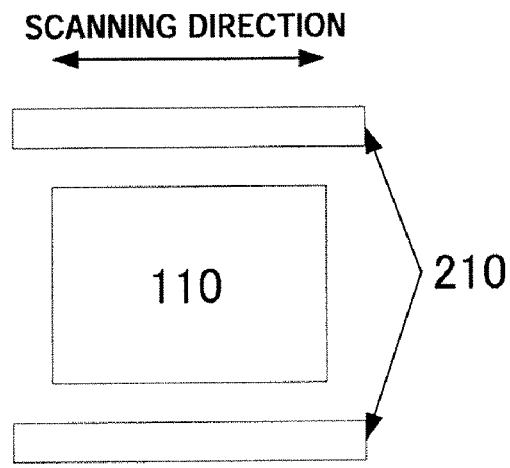
FIG. 6 is a view showing the arrangement of electrodes of Embodiment 1.

With respect to the surrounding manners of the original 100 by the electrode 210, several patterns are shown in FIGS. 3 to 6, but the surrounding manners are not limited to them. In order to prevent the particles from coming in whole circumstance directions of the original 100, the surrounding manners shown in FIGS. 3 and 4 are preferable. If a particle generating area is known, for example the particles come from a scanning direction of the original stage 120, the electrode 210 can be arranged as shown in FIG. 5. FIG. 6 is an arrangement example of the electrode 210 in the case where the particles come from a non-scanning direction.

The electrode 210 is held by the original stage 120 with sandwiching an insulator 220. By sandwiching the insulator 220, the original chuck 110 and the original 100 are prevented from being charged, and adherence of the particles to the original chuck 110 and the original 100 can be avoided.

In the embodiment, as a facing member which forms an electric field together with the electrode 210 arranged as described above, an optical barrel 10 is positioned. By applying a voltage between the optical barrel 10 and the electrode 210, the electric field is formed between the electrode 210 and the optical barrel 10. Thus, the optical barrel 10 is used as an electric field forming member. In this case, as described later, it is preferable that the original 100 and the optical barrel 10 have the same electric potential. Thus, the optical barrel 10 as an electric field forming member is provided so that an absolute value of the electric potential difference with respect to the electrode 210 is greater than an absolute value of the electric potential difference with respect to the original 100 at a position facing the electrode 210.

The electric field formed between the electrode 210 and the optical barrel 10 is formed outside the original 100 so that lines of electric force by the electric field are substantially vertical to the original 100. By forming such an electric field, the lines of electric force described above produce an effect like a curtain which blocks the particles coming from outside the original 100 to the original 100.

The above effect will be schematically described with reference to FIG. 7. By the lines of electric force LEF formed between the electrode 210 and the optical barrel 10, an electrophoretic force eE acts on a particle 300 and the track of the particle 300 can be changed. The particle 300 flitting in the exposure apparatus 50 is little affected by a fluid resistance since the inside of the exposure apparatus 50 is under a high-vacuum atmosphere. The particle 300 entering a space sandwiched by the electrode 210 and the optical barrel 10 only receives the gravity mg and the electrophoretic force eE. When the diameter of the particle 300 is around several tens of nanometers, the electrophoretic force eE is dominant compared to the gravity mg.

As a voltage applied to the electrode 210, the voltage having either positive polarity or a negative polarity can be used. If a negative voltage is applied to the electrode 210, a negatively-charged particle is captured by the optical barrel 10 and a positively-charged particle is captured by the electrode 210. On the other hand, if a positive voltage is applied to the electrode 210, the negatively-charged particle is captured by the electrode 210 and the positively-charged particle is captured by the optical barrel 10.

In the case where the particle captured by the optical barrel 10 has a conductive property such as a metal, when the particle contacts the optical barrel 10, the charge of the particle is transferred to the optical barrel 10 and the particle continues to adhere to the optical barrel 10 by the van der Waals' force.

On the other hand, in the case where the particle captured by the optical barrel 10 has an insulation property, the charge is not easily transferred to the optical barrel 10 compared to the conductive particle as described above. Such a particle continues to adhere to the optical barrel 10 by the electrostatic force and the van der Walls' force in the electric field formed between the electrode 210 and the optical barrel 10.

Figure 8:
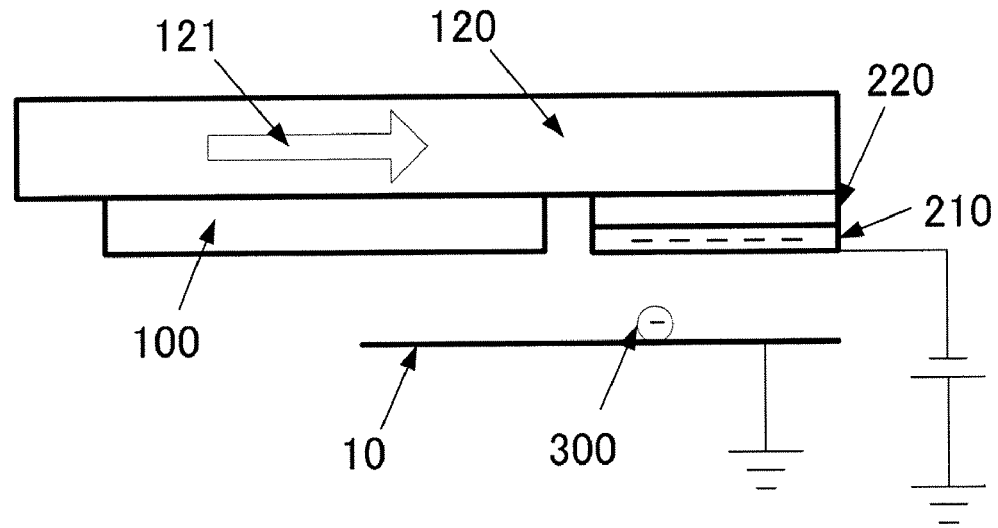
Figure 9:
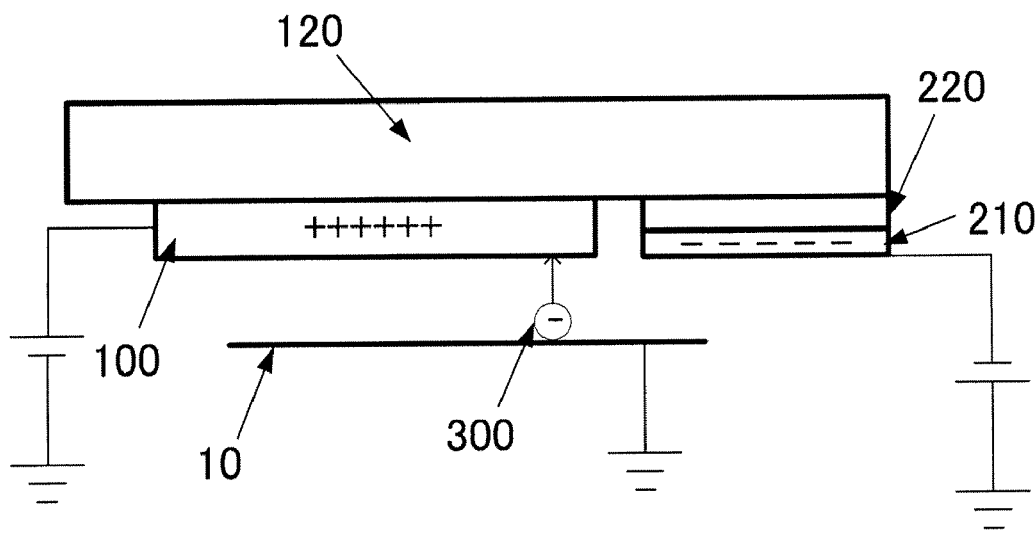

In the case where the particle 300 having the insulation property whose charge is not easily transferred is adhered to the optical barrel 10, when the original stage 120 passes over the adhered area of the particle 300, a problem shown in FIGS. 8 and 9 can occur. FIG. 8 shows a state where the particle 300 is adhered to the optical barrel 10 by the electric field formed between the electrode 210 and the optical barrel 10. When the original stage 120 in a state shown in FIG. 8 moves in a direction of an arrow 121 shown in FIG. 8, the particle 300 is sandwiched by the original 100 and the optical barrel 10 as shown in FIG. 9.

In a state shown in FIG. 9, when the electric field is formed between the original 100 and the optical barrel 10, the particle 300 can be attracted and adhered to the original 100 in accordance with the charge state of the particle 300. In order not to attract the particle 300 to the original 100, the electric field in which a repulsive force works with respect to the particle 300 can be formed between the original 100 and the optical barrel 10.

However, when the electric field is not formed between the electrode 210 and the optical barrel 10 for the reason of the exchange or the maintenance of the original 100, or the like, it is difficult to determine whether the particle adhered to the optical barrel 10 is positively charged or negatively charged. In the case where the positively-charged particle and the negatively-charged particle are mixed, if the electric potential difference is generated between the original 100 and the optical barrel 10, either the positively-charged particle or the negatively-charged particle is adhered to the original 100.

Therefore, in order to avoid the problem as described above, it is preferable that the original 100 and the optical barrel 10 are kept to be in the same electric potential so that the electric field is not formed between the original 100 and the optical barrel 10.

Figure 7:
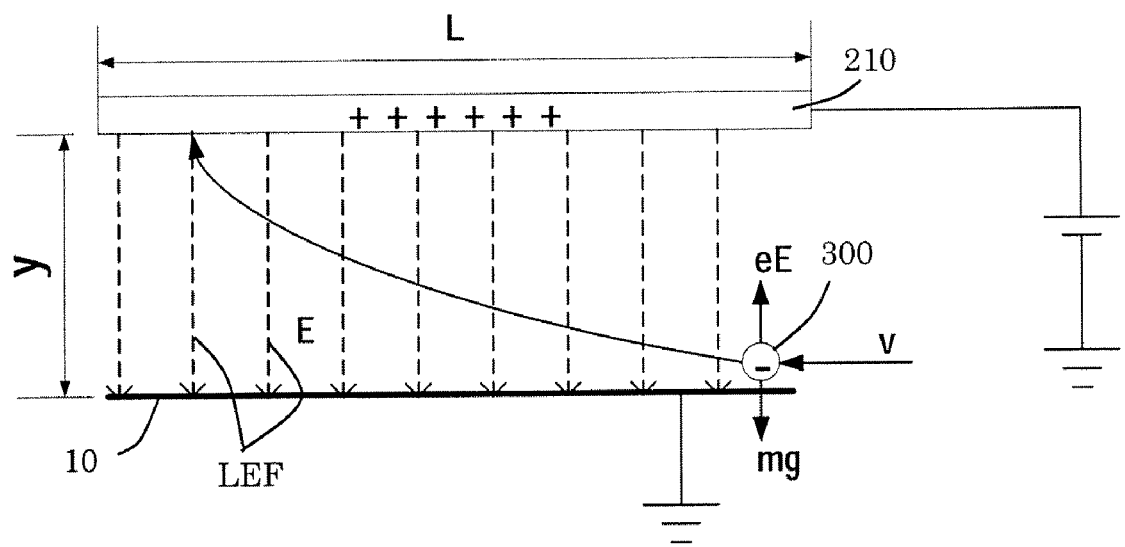
FIGS. 7 to 10 are schematic views illustrating the effect of Embodiment 1.

In order to change the track of the particle and capture the particle before the particle entering the inside of the space sandwiched between the electrode 210 and the facing member reaches the original 100, a horizontal length (width) L of the electrode 210, the distance y between the electrode 210 and the optical barrel 10, and the voltage applied to the electrode 210 as shown in FIG. 7 are important parameters.

Figure 10:
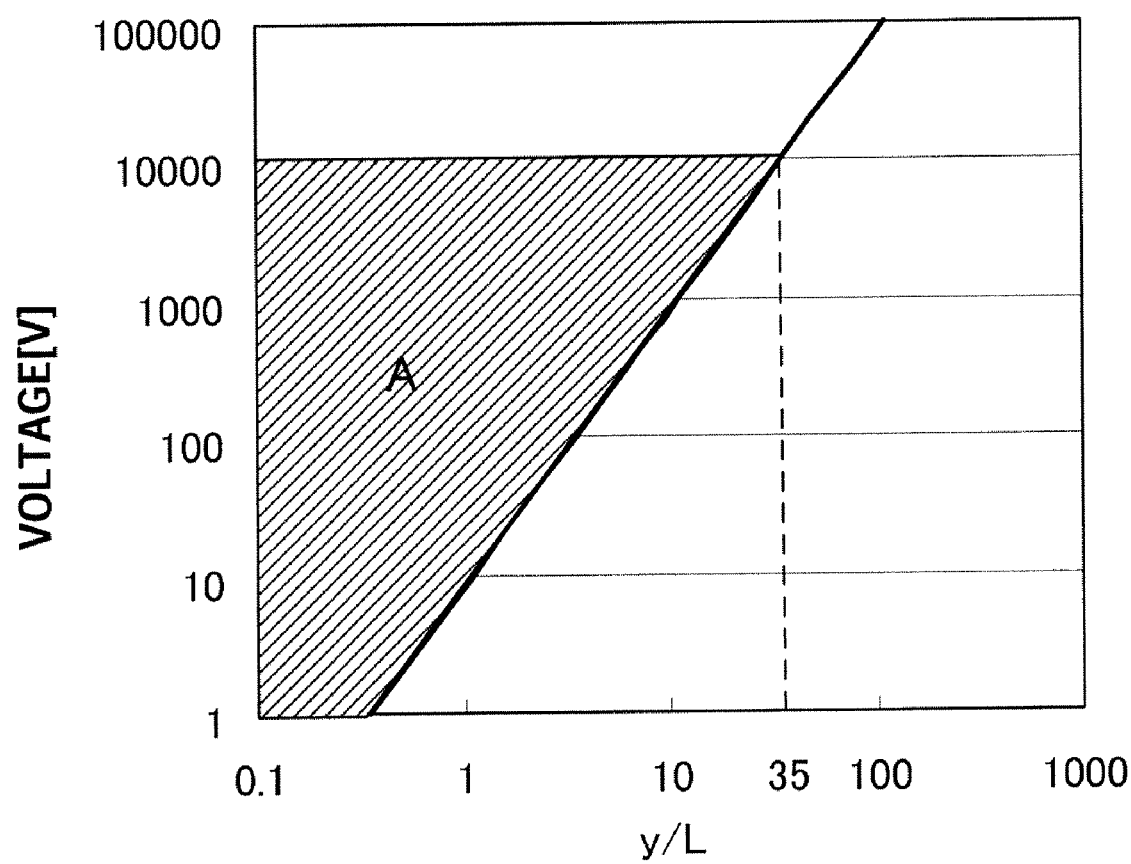

FIG. 10 represents the horizontal length L and the distance y of the electrode 210 as an aspect ratio y/L, and shows a relationship between the applied voltage and the aspect ratio y/L for capturing the metal particle that has a diameter of 30 nm.

A precondition for introducing the above relation will be described. When the electric field is formed between the electrode 210 and the facing member under the vacuum environment like the present embodiment, the upper limit of the voltage applied to the electrode 210 is generally around 10 kV/mm. In a creeping discharge by the insulator 220, when a ceramic is used as the insulator 220 for example, the upper limit is around 10 kV/mm. When the electrode 210 is positioned in the vicinity of the original 100, it is difficult to ensure enough distance from other members and thickness of the insulator because of the design limitation and these may be a few millimeter. Therefore, the voltage that can be practically applied to the electrode 210 may be around 10 kV.

However, even if the applied voltage is equal to or lower than 10 kV, when the electrode 210 has an edge or a corner, the electric field intensity at the part is large. In this case, it is easy to discharge. Therefore, it is preferable that the edge or the corner of the electrode 210 is processed to be curved.

A motion velocity v of the particle generated in the vicinity of the original stage 120 may be around 2.4 m/s which corresponds to the velocity of the original stage 120. The moving velocity of the original stage 120 is determined by considering the productivity as an exposure apparatus. In order to protect the original 100 from the particle, the particle which has a velocity similar to that of the original stage 120 should be assumed.

A charged valence of the particle is assumed to be univalent, and a strict condition is imposed for acting the electrophoretic force.

Under such conditions, in order to capture the particle, when the applied voltage is 10 kV, the aspect ratio y/L can be set to 35 at a maximum as shown in FIG. 10. Furthermore, when the applied voltage is set to lower than 10 kV, the aspect ratio can be set to lower than 35. Therefore, if the horizontal length L and the distance y of the electrode and the parameter of the voltage applied to the electrode 210 are included in an area A shown in FIG. 10, the assumed particle can be captured before it reaches the original 100.

When the diameter of the particle is greater than 30 nm, an inertia force is greater than that of the particle whose diameter is 30 nm and changing the track of the particle by the electric field is rather difficult. However, the problem can be resolved by setting the aspect ratio of the horizontal length L and the distance y to lower than 35.

Embodiment 2

Next, Embodiment 2 of the present invention will be described. The basic configuration of the present embodiment is the same as that of the exposure apparatus of Embodiment 1. Therefore, in the present embodiment, the description is focused only on the parts different from those of Embodiment 1, and the description of other parts is omitted. In FIGS. 11 to 14, the same reference numerals are used for components which are the same as those shown in FIG. 2, and the description of the components is omitted.

Figure 11:
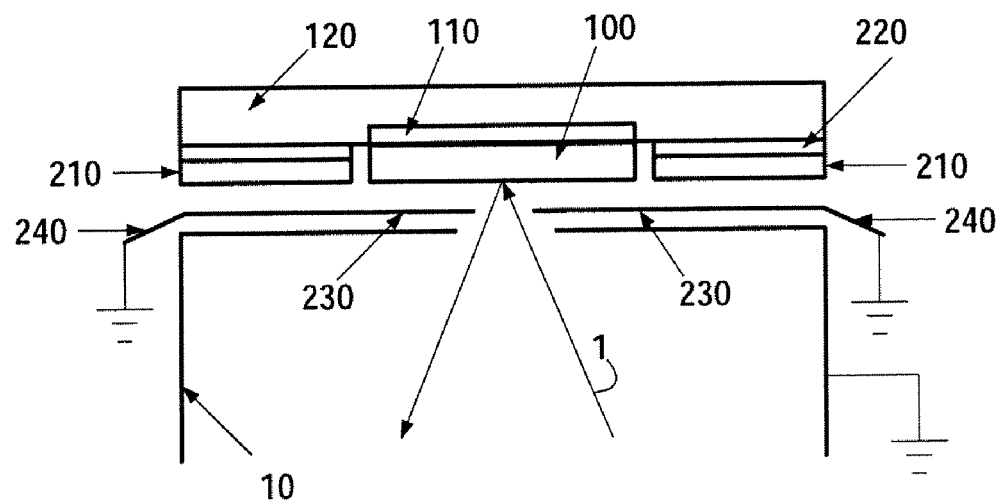
FIG. 11 is a schematic cross-sectional view showing the vicinity of an original of an EUV exposure apparatus that is Embodiment 2 of the present invention.

The present embodiment is a variation of Embodiment 1 in the case where an optical path limiting member 230 such as an aperture or a masking blade which limits the optical path of the EUV light 1 is positioned between the electrode 210 and the optical barrel 10. FIG. 11 shows the schematic view of the configuration. By positioning the optical path limiting member 230, the EUV light 1 can be limited and the unnecessary exposure of the resist can be avoided.

In the present embodiment, the electric field which changes the track of the particle is formed between the electrode 210 and the aperture or the masking blade that is the optical path limiting member 230.

The electric field is formed outside the original 100 and the lines of electric force by the electric field are formed substantially vertically to the original 100. By forming such an electric field, the lines of electric force as described above produce an effect like a curtain which blocks the particles coming from outside the original 100 to the original 100.

As a voltage applied to the electrode 210, the voltage having either a positive polarity or a negative polarity can be used. In the case where a negative voltage is applied to the electrode 210, if the coming particle is negatively charged, the particle is captured by the optical path limiting member 230.

On the contrary, if the particle is positively charged, the particle is captured by the electrode 210.

As described in Embodiment 1, in order to prevent the particle adhered to the optical path limiting member 230 from adhering to the original 100, the original 100 and the optical path limiting member 230 have the same electrical potential.

In the present embodiment, the particle or the gas which comes between the optical path limiting member 230 and the optical barrel 10 may be adhered to the original 100. In this case, the above problem can be resolved by positioning a dustproof plate 240. It is preferable that the dustproof plate 240 is positioned so that the particle or the gas is not easily come in the space between the optical path limiting member 230 and the optical barrel 10, and that the particles or the like is effectively prevented from entering the space.

Embodiment 3

Next, Embodiment 3 of the present invention will be described. The basic configuration of the present embodiment is the same as that of the exposure apparatus of Embodiment 1. Therefore, in the present embodiment, the description is focused only on the parts different from those of Embodiment 1, and the description of other parts is omitted.

Figure 12:
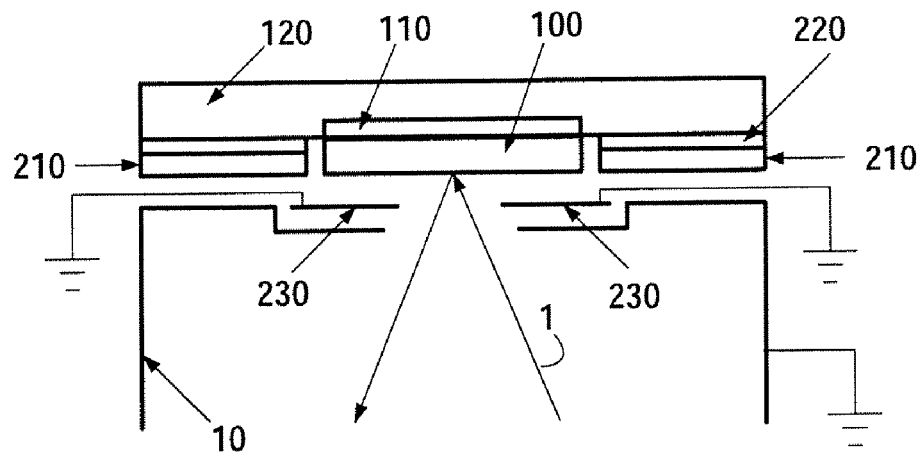
FIG. 12 is a schematic cross-sectional view showing the vicinity of an original of an EUV exposure apparatus that is Embodiment 3 of the present invention.

The present embodiment is a variation of Embodiment 1 and Embodiment 2 in the case where both of an optical barrel 10 and an optical path limiting member 230 are provided. FIG. 12 shows the schematic view of the configuration. The present embodiment is an example of the configuration where the particle does not come between the optical path limiting member 230 and the optical barrel 10 by narrowing the space sandwiched between the optical path limiting member 230 and the optical barrel 10 of Embodiment 2. Under such a configuration, the dustproof plate 240 of Embodiment 2 is not necessary to be positioned.

The electric field which changes the track of the particle is formed between the electrode 210 and the optical barrel 10 and is formed between the electrode 210 and the aperture or the masking blade that is the optical path limiting member 230.

The electric field is formed outside the original 100 and the lines of electric force by the electric field are formed substantially vertically to the original 100. By forming such an electric field, the lines of electric force as described above produce an effect like a curtain which blocks the particles coming from outside the original 100 to the original 100.

As a voltage applied to the electrode 210, both a positive polarity and a negative polarity can be used. In the case where a negative voltage is applied to the electrode 210, if the coming particle is negatively charged, the particle is captured by the optical barrel 10 or the optical path limiting member 230. On the contrary, if the particle is positively charged, the particle is captured by the electrode 210.

As described in Embodiment 1, in order to prevent the particle adhered to the optical barrel 10 or the optical path limiting member 230 from adhering to the original 100, the original 100, the optical barrel 10 and the optical path limiting member 230 have the same electrical potential.

Furthermore, in Embodiments 1 to 3, the horizontal height of the electrode 210 and the original 100 are set to the same in order to narrow the distance with respect to the facing member. Therefore, the particle can be prevented from adhering to the original 100 and the conductance from the space where the original stage 120 is positioned to the inside of the optical barrel 10 can be reduced. By reducing the conductance from the space where the original stage 120 is positioned to the inside of the optical barrel 10, the flow of the gas from the space where the original stage 120 is positioned to the inside of the optical barrel 10 can be reduced, and the degree of vacuum in the optical barrel 10 can also be improved.

Embodiment 4

Next, Embodiment 4 of the present invention will be described. The basic configuration of the present embodiment is the same as that of the exposure apparatus of Embodiment 1. Therefore, in the present embodiment, the description is focused only on the parts different from those of Embodiment 1, and the description of other parts is omitted.

The exposure apparatus of the present embodiment includes an electric field shielding member 250. The electric field shielding member 250 is provided between the original chuck 110 and the electrode 210 for preventing the electric field formed between the electrode 210 and the optical barrel 10 from influencing the original stage 120. The present embodiment is preferable for suppressing the electric field which is formed between the electrode 210 and the original 100, in addition to the effect of Embodiment 1.

Figure 13:
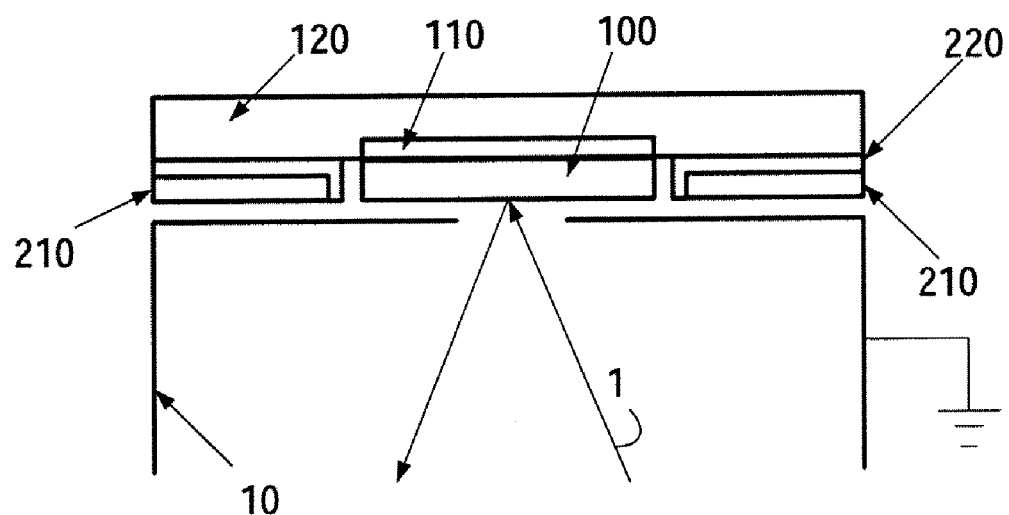
FIGS. 13 and 14 are schematic cross-sectional views showing the vicinity of an original of an EUV exposure apparatus that is Embodiment 4 of the present invention.
Figure 14:
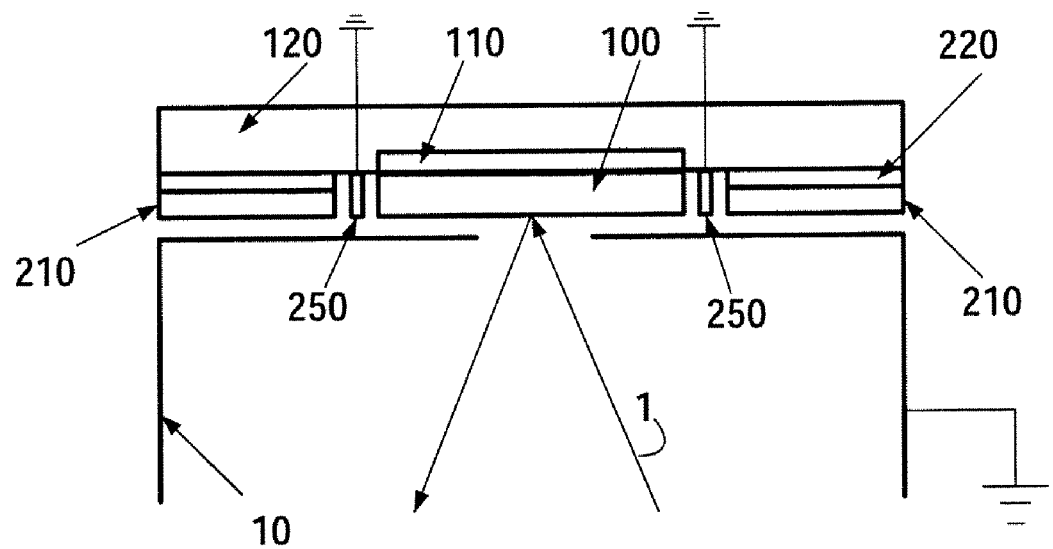

FIGS. 13 and 14 show the schematic views of the exposure apparatus including the electric field shielding member 250. The electric field shielding member 250 shown in FIG. 13 is integrated with the insulator 220 and is positioned between the electrode 210 and the original 100. The electric field shielding member 250 shown in FIG. 14 is grounded and is made up of a plate or the like. By applying the configuration shown in FIGS. 13 and 14, the electric field formed between the electrode 210 and the original 100 can be reduced and the particle can be effectively prevented from adhering to the side of the original 100.

According to each of the above embodiments, the exposure apparatus that effectively reduces the particle adherence to the original can be realized.

Furthermore, according to each of the above embodiments, the decreases of the yield of the exposure apparatus and the reliability of devices which are caused by the particle adherence to the original can be avoided.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

For example, FIGS. 2 and 11 to 14 show the case where the optical barrel 10 or the optical path limiting member 230 that is an electric field forming member is grounded. However, the electric field has only to be formed between the electrode 210 and the optical barrel 10 or the optical path limiting member 230 or both of them, and the voltage can also be applied to the optical barrel 10 or the optical path limiting member 230. However, as described above, in order to prevent the particle from adhering to the original 100, the original 100 and the optical barrel 10 or the optical path limiting member 230 or both of them need to be configured to have the same electric potential.

This application claims the benefit of Japanese Patent Application No. 2007-299963, filed on Nov. 20, 2007, which is hereby incorporated by reference herein in its entirety.

What is claimed is:

1. An exposure apparatus configured to expose a pattern formed on an original onto a substrate using extreme ultraviolet light, the exposure apparatus comprising:
   a stage configured to move at the time of exposure;
   an electrostatic chuck which is provided on the stage and is configured to hold the original;

an electrode which is provided outside the electrostatic chuck on the stage via an insulator; and an electric field forming member which is provided so that an absolute value of an electric potential difference with respect to the electrode is greater than an absolute value of an electric potential difference with respect to the original at a position facing the electrode, wherein the electric field forming member is an optical barrel of a projection optical system.

2. The exposure apparatus according to claim 1, wherein the electric field forming member has an electric potential equal to that of the original.

3. The exposure apparatus according to claim 1, wherein a value of y/L is equal to or lower than 35, where a width of the electrode is L and a distance between the electrode and the electric field forming member is y.

4. An exposure apparatus configured to expose a pattern formed on an original onto a substrate using extreme ultraviolet light, the exposure apparatus comprising:

a stage configured to move at the time of exposure;

an electrostatic chuck which is provided on the stage and is configured to hold the original;

an electrode which is provided outside the electrostatic chuck on the stage via an insulator; and an electric field forming member which is provided so that an absolute value of an electric potential difference with respect to the electrode is greater than an absolute value of an electric potential difference with respect to the original at a position facing the electrode, wherein the electric field forming member is an optical path limiting member which is positioned between an optical barrel of an projection optical system and the stage.

5. The exposure apparatus according to claim 4, further comprising a dustproof plate configured to prevent a particle from entering a space between the optical path limiting member and the optical barrel.

6. An exposure apparatus configured to expose a pattern formed on an original onto a substrate using extreme ultraviolet light, the exposure apparatus comprising:

a stage configured to move at the time of exposure;

an electrostatic chuck which is provided on the stage and is configured to hold the original;

an electrode which is provided outside the electrostatic chuck on the stage via an insulator;

an electric field forming member which is provided so that an absolute value of an electric potential difference with respect to the electrode is greater than an absolute value of an electric potential difference with respect to the original at a position facing the electrode; and an electric field shielding member which is provided between the electrostatic chuck on the stage and the electrode and is configured to prevent an electric field formed between the electrode and the electric field forming member from influencing the stage.

7. The exposure apparatus according to claim 6, wherein the electric field shielding member is integrated with the insulator.

* * * * *